US012769906B2

(12) United States Patent
El-Chami

(10) Patent No.: US 12,769,906 B2
(45) Date of Patent: Oct. 20, 2026

(54) MACHINE LEARNING PIPELINE INSPECTION METHOD AND SYSTEM USING CALIPER PIG DATA

(71) Applicant: PIPECARE US, LLC, Houston, TX (US)

(72) Inventor: Muhamed-Khaled El-Chami, Dubai (AE)

(73) Assignee: PIPECARE US, LLC, Houston, TX (US)

( * ) Notice: Subject to any disclaimer, the term of this patent is extended or adjusted under 35 U.S.C. 154(b) by 964 days.

(21) Appl. No.: 17/879,289

(22) Filed: Aug. 2, 2022

(65) Prior Publication Data

US 2023/0229833 A1 Jul. 20, 2023

(51) Int. Cl.
*G06F 30/27* (2020.01)
*G06F 30/17* (2020.01)

(52) U.S. Cl.
CPC .............. *G06F 30/27* (2020.01); *G06F 30/17* (2020.01)

(58) Field of Classification Search
CPC ...... G06F 30/17; G06F 30/12; G06F 2111/00; G06F 2119/22; G06F 30/27
See application file for complete search history.

(56) References Cited

U.S. PATENT DOCUMENTS

| | | | | |
|---|---|---|---|---|
| 4,457,073 | A * | 7/1984 | Payne | G01B 5/207 73/866.5 |
| 4,953,412 | A | 9/1990 | Rosenberg et al. | |
| 5,088,336 | A | 2/1992 | Rosenberg et al. | |
| 6,857,329 | B2 | 2/2005 | Savard | |
| 11,156,911 | B2 * | 10/2021 | Tabaian | G03B 37/06 |
| 2004/0134289 | A1 | 7/2004 | Savard | |
| 2011/0167914 | A1 * | 7/2011 | Sutherland | F17D 1/00 73/643 |
| 2021/0332930 | A1 | 10/2021 | Tummapalli et al. | |

FOREIGN PATENT DOCUMENTS

| | | |
|---|---|---|
| WO | 2007020438 | 2/2007 |

* cited by examiner

*Primary Examiner* — Kibrom K Gebresilassie
(74) *Attorney, Agent, or Firm* — K&L Gates LLP

(57) ABSTRACT

A machine learning pipeline inspection method and system using caliper pig data is disclosed herein. The machine learning pipeline inspection method and system are configured to use one or more machine learning models to automatically identify pipeline features of interest for a pipeline inspection. The machine learning model may be included on a caliper pig to provide pipeline feature identification in real-time or near real-time. Alternatively, the machine learning model may be provided on a computer that is separate from a caliper pig. In these alternative embodiments, caliper pig data is downloaded or otherwise transferred to the computer for processing by the machine learning model.

20 Claims, 13 Drawing Sheets

600

800

900

1000

MACHINE LEARNING PIPELINE INSPECTION METHOD AND SYSTEM USING CALIPER PIG DATA

PRIORITY CLAIM

This application claims priority to Russian Patent Application No. 2022100791, filed Jan. 17, 2022, the entire contents of which are hereby incorporated by reference and relied upon.

BACKGROUND

Despite governmental and societal efforts to more widely deploy renewable energy sources, such as solar, wind, and hydroelectric, the production and generation of crude oil and natural gas has increased significantly to keep pace with worldwide energy consumption. The increased production of crude oil and natural gas has fostered the creation of new long-range pipelines across the world. By some estimates, there are at least 2,380 operating oil and gas pipelines distributed across the world. The total length of these pipelines is more than 730,000 miles.

With increased societal scrutiny of the oil and natural gas industry, any pipeline leak or failure is widely reported and criticized. Accordingly, pipeline operators are under severe financial and social pressure to avoid incidents that cause crude oil and natural gas leaks. As such, pipeline integrity is the cornerstone of many industrial and engineering systems. Pipeline integrity refers to the degree to which pipelines and related components are free from defect or damage.

Pipelines are subject to impacts and possible damage from the surrounding environment and third parties (e.g., vandalism, unauthorized hot tapping, etc.). Buried pipeline systems may traverse sections of soil that is prone to shifting from earthquakes, landslides, washouts, floods, or natural ground settling. Large strains may be accumulated in these buried pipes during long and short-term ground movements, which may affect the performance of the pipes. Mechanical deformations in the pipe at time of manufacture, created during installation, or created overtime due to corrosion and stress can cause accelerated cracking growth. Corroded dents also pose a serious threat to pipeline integrity. Further, significant reductions of a pipeline's circular shape (e.g., ovality) can negatively affect the flow of oil or natural gas and cause excessive consumption of power required to pump the oil/natural gas. It is vitally important to locate such geometry deviations on any pipeline before a leak or failure occurs.

To minimize the risk of failure or a leak, pipelines are diligently monitored and inspected. One of the primary inspection methods utilized by the pipeline industry is in-line inspection. Commonly, an in-line inspection tool, known in the industry as a caliper pig, is inserted and propelled through a pipeline. The caliper pig includes a number of sensor arms and odometers that contact an inside surface of a pipeline. Typically, a caliper pig has a number of sensor arms that adequately cover the complete interior circumference of a pipeline. The sensor arms move downward when a pipe deformity extends inward towards an interior of a pipe and move upward when a pipe deformity extends outwards. During an inspection, the caliper pig moves at a rate between 0.1 meter/second to 5 meters/second and records how much each sensor arm moves up and down along an interior surface of the pipeline. Data from the sensor arms are stored in a raw data file that relates sensor arm movement to distance traveled, as measured by the odometer.

Typically, a pipeline operator uses a subject matter expert to process the raw data file through an in-line inspection tool to detect different anomalies and features in pipelines. Oftentimes the subject matter expert has to spend days to weeks processing the raw data into a three-dimensional model and identifying possible damage and other areas of concern. This can include determining whether a defect is a dent, a bend, or a simply a joint. It takes a great deal of time to analyze the data granularity at different levels to detect the smallest cracks and bends to large shifts and deformations. This manual analysis is inefficient and costly for pipeline operators, especially for pipelines that are hundreds to thousands of miles in length. Additionally, pipeline leaks can occur during the analysis that otherwise could have been caught immediately after an inspection.

A need accordingly exists for a machine learning pipeline inspection method and system.

SUMMARY

Systems, methods, and apparatus for using machine learning to identify pipeline anomalies using data from a caliper pig are disclosed herein. The machine learning pipeline inspection method and system are configured to use one or more machine learning models to automatically identify pipeline features of interest for a pipeline inspection. The machine learning model may be included on a caliper pig to provide pipeline feature identification in real-time or near real-time. Alternatively, the machine learning model may be provided on a computer that is separate from a caliper pig. In these alternative embodiments, caliper pig data is downloaded or otherwise transferred to the computer for processing by the machine learning model.

The machine learning model is configured to use odometer data and caliper arm measurement data to identify pipeline features. The possible features that can be identified include a deposit, a buckle, a dent, a presence of an ovality, a presence of an offtake, a presence of a fixture, a presence of a tee, a presence of a valve, a bend, a diameter change, a wall thickness change, a presence of a through-hole, a presence of a stress/strain zone, a presence of a weld, and/or a hard spot. In addition to identifying pipeline features of concern, the machine learning model is configured to determine axial and angular locations of each pipeline feature in addition to dimensions and/or a size. The machine learning model is configured to output a report and/or a three-dimensional model that shows locations of the pipeline features along a pipeline along with an indication of the feature class, size, and dimensions. The machine learning model is configured to quickly generate the report and/or three-dimensional model after an inspection run to enable a pipeline operator to immediately address any pipeline damage or defects before leaks develop.

In light of the disclosure set forth herein, and without limiting the disclosure in any way, in a first aspect of the present disclosure, which may be combined with any other aspect, or portion thereof, described herein a system for inspecting pipelines includes a caliper pig having a front section, a middle section, and a rear section, the caliper pig including a bumper located at the front section and configure to form a leading surface through a pipeline, at least two spring-supported odometer arms located at the middle section or the front section, each odometer arm including a wheel sensor configured to contact an inner surface of the pipeline for measuring a distance traveled, a first cup located between the front section and the middle section, the first cup configured to have a diameter that is less than an inner diameter of the pipeline, a second cup located at the rear section, the second cup configured to have a diameter that is less than the inner diameter of the pipeline, a ring of caliper arms located in the middle section, the ring configured to cover a circumference of the inner surface of the pipeline, each caliper arm configured to move upward and downward to measure surface features of the pipeline and including a movement sensor to detect the upward and downward movement of the caliper arm, a transmitter configured to transmit a wireless signal to enable locating the caliper pig, a memory device, and a processor communicatively coupled to the movement sensors and the memory device. The processor is configured to store wheel rotation information from the odometer wheel sensors to the memory device, and store caliper arm measurement data for each of the caliper arms to the memory device in association with the wheel rotation information. The system also includes a computer including a machine learning model configured to receive the wheel rotation information and the caliper arm measurement data from the processor of the caliper pig, combine the caliper arm measurement data for the different caliper arms that correspond to the same wheel rotation information, parse the caliper arm measurement data into separate pipeline sections based on the wheel rotation information, and sequentially process each pipeline section using the machine learning model to detect pipeline features, assign a feature class to each pipeline feature, and determine an axial position, an angular position, linear dimensions, and a size for each pipeline feature.

In accordance with a second aspect of the present disclosure, which may be used in combination with any other aspect listed herein unless stated otherwise, the computer is communicatively coupled to the processor via at least one of a wired connection or a wireless connection.

In accordance with a third aspect of the present disclosure, which may be used in combination with any other aspect listed herein unless stated otherwise, the computer is integrated with the processor.

In accordance with a fourth aspect of the present disclosure, which may be used in combination with any other aspect listed herein unless stated otherwise, each of the caliper arms includes a current sensor configured to detect a current within of the pipeline and generate current sense data, and the processor is configured to store the current sense data to the memory device in conjunction with the caliper arm measurement data.

In accordance with a fifth aspect of the present disclosure, which may be used in combination with any other aspect listed herein unless stated otherwise, the machine learning model is configured to additionally use the current sense data to detect pipeline features and assigning the feature class to each pipeline feature.

In accordance with a sixth aspect of the present disclosure, which may be used in combination with any other aspect listed herein unless stated otherwise, the caliper pig further includes at least one of a clock generating time data, a temperature sensor generating temperature data, a pressure sensor generating pressure data, or an inertial measurement unit configured to generate angular acceleration data.

In accordance with a seventh aspect of the present disclosure, which may be used in combination with any other aspect listed herein unless stated otherwise, the processor is configured to store the at least one of the time data, the temperature data, the pressure data, or the angular acceleration data to the memory device in conjunction with the caliper arm measurement data.

In accordance with an eighth aspect of the present disclosure, which may be used in combination with any other aspect listed herein unless stated otherwise, the machine learning model is configured to additionally use the at least one of the time data, the temperature data, the pressure data, or the angular acceleration data to detect pipeline features and assigning the feature class to each pipeline feature.

In accordance with a ninth aspect of the present disclosure, which may be used in combination with any other aspect listed herein unless stated otherwise, the machine learning model is configured to use the caliper arm measurement data to determine pipeline joint lengths.

In accordance with a tenth aspect of the present disclosure, which may be used in combination with any other aspect listed herein unless stated otherwise, at least one of the computer or the machine learning model is configured to use at least one of the determined pipeline joint lengths, time measurements from a clock, and angular acceleration data from at least one inertial measurement unit to check data quality of the caliper arm measurement data that was acquired at high speed areas of the caliper pig while inspecting the pipeline.

In accordance with an eleventh aspect of the present disclosure, which may be used in combination with any other aspect listed herein unless stated otherwise, at least one of the computer or the machine learning model is configured to use the determined pipeline joint lengths to classify corresponding caliper arm measurement data as a pipeline joint.

In accordance with a twelfth aspect of the present disclosure, which may be used in combination with any other aspect listed herein unless stated otherwise, at least one of the computer or the machine learning model is configured to create an electronic report that includes the identified pipeline features specifying the assigned feature class, the axial position, the angular position, the linear dimensions, and the size.

In accordance with a thirteenth aspect of the present disclosure, which may be used in combination with any other aspect listed herein unless stated otherwise, at least one of the computer or the machine learning model is configured to cause the electronic report to be displayed to transmit the electronic report to a client device for display.

In accordance with a fourteenth aspect of the present disclosure, which may be used in combination with any other aspect listed herein unless stated otherwise, at least one of the computer or the machine learning model is configured to generate a three-dimensional model of the pipeline using the identified pipeline features specifying the assigned feature class, the axial position, the angular position, the linear dimensions, and the size.

In accordance with a fifteenth aspect of the present disclosure, which may be used in combination with any other aspect listed herein unless stated otherwise, at least one of the computer or the machine learning model is configured to highlight or tag the identified pipeline features on the three-dimensional model.

In accordance with a sixteenth aspect of the present disclosure, which may be used in combination with any other aspect listed herein unless stated otherwise, the feature class includes at least one of a deposit, a buckle, a dent, a presence of an ovality, a presence of an offtake, a presence of a fixture, a presence of a tee, a presence of a valve, a bend, a diameter change, a wall thickness change, a presence of a through-hole, a presence of a stress/strain zone, a presence of a weld, and/or a hard spot.

In accordance with a seventeenth aspect of the present disclosure, which may be used in combination with any other aspect listed herein unless stated otherwise, the ring of caliper arms is a first ring of caliper arms, the caliper pig including a second ring of caliper arms located at the rear section, each caliper arm configured to move upward and downward to measure surface features of the pipeline and including a movement sensor to detect the upward and downward movement of the caliper arm.

In accordance with an eighteenth aspect of the present disclosure, which may be used in combination with any other aspect listed herein unless stated otherwise, the system further includes at least one support ring located at the front section or the middle section, the support ring including wheeled arms for supporting the caliper pig.

In accordance with a nineteenth aspect of the present disclosure, which may be used in combination with any other aspect listed herein unless stated otherwise, a machine learning model for inspecting pipelines is configured to receive wheel rotation information and caliper arm measurement data from a processor of a caliper pig, combine the caliper arm measurement data for the different caliper arms that correspond to the same wheel rotation information, parse the caliper arm measurement data into separate pipeline sections based on the wheel rotation information, and sequentially process each pipeline section using the machine learning model to detect pipeline features, assign a feature class to each pipeline feature, and determine an axial position, an angular position, linear dimensions, and a size for each pipeline feature.

In accordance with a twentieth aspect of the present disclosure, which may be used in combination with any other aspect listed herein unless stated otherwise, the feature class includes at least one of a deposit, a buckle, a dent, a presence of an ovality, a presence of an offtake, a presence of a fixture, a presence of a tee, a presence of a valve, a bend, a diameter change, wall thickness change, a presence of a through-hole, a presence of a stress/strain zone, a presence of a weld, and/or a hard spot.

In a twenty-first aspect, any of the features, functionality and alternatives described in connection with any one or more of FIGS. 1 to 13 may be combined with any of the features, functionality and alternatives described in connection with any other of FIGS. 1 to 13.

In light of the present disclosure and the above aspects, it is therefore an advantage of the present disclosure to use a machine learning model to quickly process caliper arm measurement data for a pipeline operator to locate areas of concern.

It is another advantage of the present disclosure to use caliper arm measurement data from a caliper pig to automatically identify pipeline features of concern to a pipeline operator.

It is another advantage of the present disclosure to automatically generate pipeline reports and a three-dimensional model of a pipeline under inspection using caliper arm measurement data from a caliper pig.

Additional features and advantages are described in, and will be apparent from, the following Detailed Description and the Figures. The features and advantages described herein are not all-inclusive and, in particular, many additional features and advantages will be apparent to one of ordinary skill in the art in view of the figures and description. Also, any particular embodiment does not have to have all of the advantages listed herein and it is expressly contemplated to claim individual advantageous embodiments separately. Moreover, it should be noted that the language used in the specification has been selected principally for readability and instructional purposes, and not to limit the scope of the inventive subject matter.

DETAILED DESCRIPTION

Figure 1:
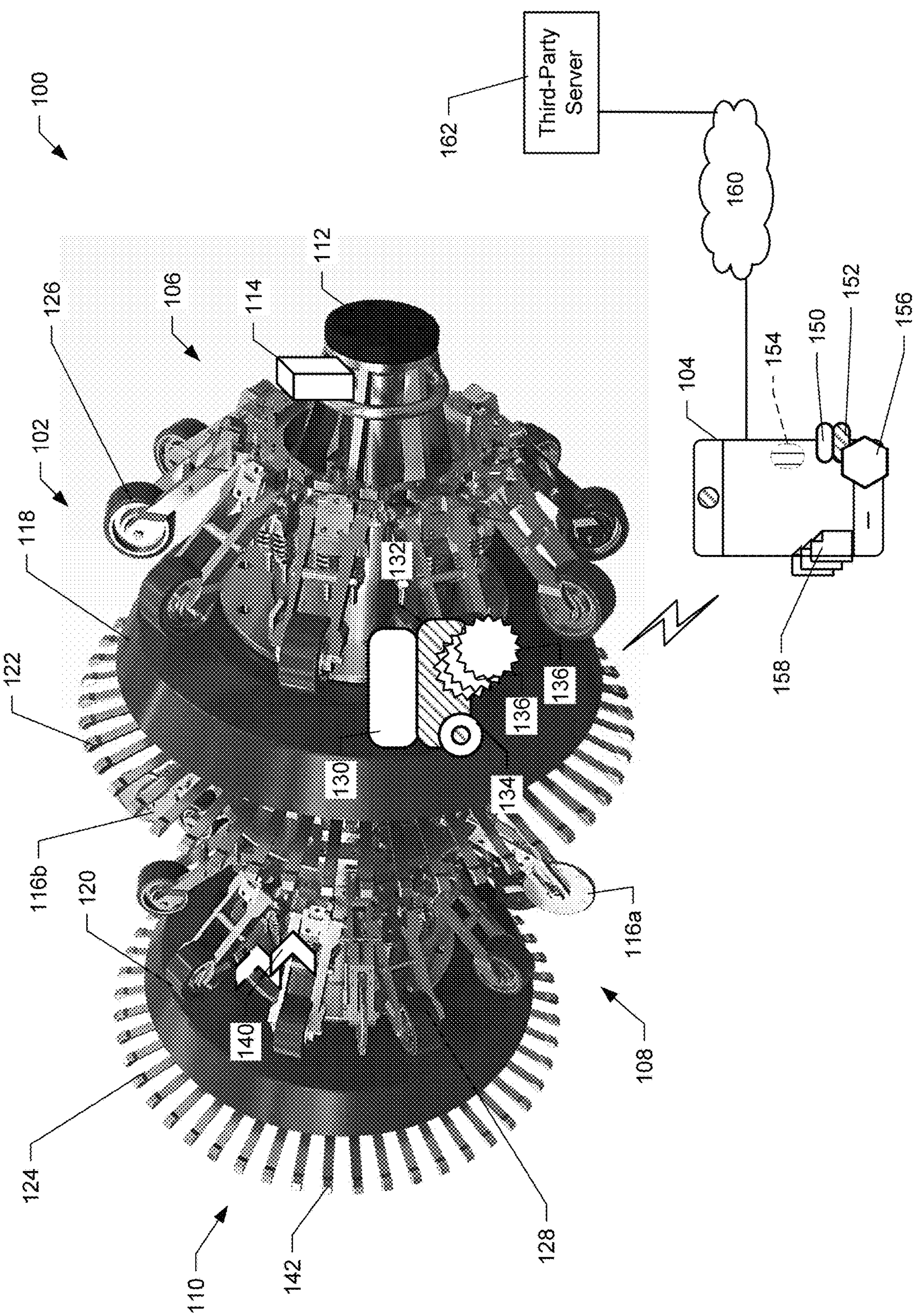
FIG. 1 is a diagram of an example pipeline inspection system including a caliper pig, according to an example embodiment of the present disclosure.

A machine learning pipeline inspection method and system using caliper pig data are disclosed herein. The machine learning pipeline inspection method and system are configured to use one or more machine learning models to automatically identify pipeline features of interest for a pipeline inspection. The machine learning model may be included on a caliper pig to provide pipeline feature identification in real-time or near real-time. Alternatively, the machine learning model may be provided on a computer that is separate from a caliper pig. In these alternative embodiments, caliper pig data is downloaded or otherwise transferred to the computer for processing by the machine learning model.

As described herein, the machine learning model uses caliper pig data to identify pipeline features. Caliper pig data refers to pipeline data that is measured by a caliper pig as the caliper pig is pushed or otherwise propelled through a pipeline. The caliper pig data includes caliper arm measurement data that is indicative as to a degree of movement of each caliper arm within one or more belts of caliper arms. The degree of movement corresponds to how much an interior surface area of a pipeline is pushed inward or pushed outward relative to a normal (un-damaged) pipe. The caliper pig data also include wheel rotation information (e.g., odometer information) that indicates how far the caliper pig has traveled. The wheel rotation information is correlated with the caliper arm measurement data and/or time data from a clock to provide a representation of a complete circumference of the interior surface of the pipeline along its entire length. The caliper pig data may also include, in some embodiments, current sense data, temperature data, inertial measurement data, and/or pressure data. The current sense data, temperature data, inertial measurement data, and/or pressure data may also be correlated with the wheel rotation information and/or the caliper arm measurement data.

The machine learning model is configured to use the machine learning model to determine if the caliper pig data corresponds to one or more pipeline features along its length. The machine learning model is trained with caliper pig data that is associated with known pipeline features. The machine learning model uses this training to identify similar features for a pipeline under inspection. In some embodiments, the pipeline features that are classified by the machine learning model include deposits, buckles, dents, a presence of an ovality, a presence of offtakes, a presence of fixtures, a presence of tees, a presence of valves, bends, diameter changes, wall thickness changes, a presence of through-holes, a presence of stress/strain zones, and/or hard spots. In some embodiments, the machine learning model is configured with fewer or additional classifications.

In addition to identifying pipeline features using caliper pig data, the example machine learning model is configured to identify attributes for each pipeline feature, an axial position, an angular position, linear dimensions and/or a size/depth/ovality. The machine learning model is configured to generate an electronic report provided in one or more user interfaces that identify the pipeline features and corresponding attributes. In some embodiments, the machine learning model is configured to use the caliper pig data in conjunction with the feature identification to produce a three-dimensional model. The machine learning model is configured to highlight or otherwise provide indications (e.g., tags, color-coding, etc.) of the identified features on the three-dimensional model.

The example machine learning pipeline inspection method and system disclosed herein is accordingly configured to provide for the automated identification of pipeline damage/features/anomalies without needing manual manipulation or analysis of the caliper pig data. In some instances, the machine learning pipeline inspection method and system disclosed herein is configured to create a complete inspection report and/or three-dimensional model for an inspected pipeline within 30 minutes to nine hours after receiving the caliper pig data. The machine learning pipeline inspection method and system accordingly provides a near-real time reporting of a pipeline quality, which enables pipeline operators to respond more quickly to potential pipeline damage before leaks begin or become worse.

Example Pipeline Inspection System

FIG. 1 is a diagram of an example pipeline inspection system 100, according to an example embodiment of the present disclosure. The pipeline inspection system 100 includes at least one caliper pig 102 and a computer 104. The caliper pig 102 is configured to perform an in-line inspection of a pipeline. While FIG. 1 shows a single caliper pig 102 with the computer 104, it should be appreciated that the system 100 may include two or more caliper pigs 102 in communication with the computer 104 or multiple computers.

The caliper pig 102 includes a front section 106, a middle section 108, and a rear section 110. A bumper 112 is located at the front section 106 configured to form a leading surface through a pipeline. The bumper 112 may include one or more connection points to enable the caliper pig 102 to be removed from a pipeline after a run is completed. The front section 106 also includes a transmitter 114 that is configured to emit a signal, such as a beacon signal. The signal may include an identifier of the caliper pig 102 and is used for locating the caliper pig 102 within a pipeline. In some embodiments, the transmitter 114 may be located in the middle section 108 or the rear section 110 of the caliper pig 102.

The caliper pig 102 also includes at least two spring-supported odometer arms 116*a* and 116*b* located in the middle section 108. In other embodiments, the odometer arms 116*a* and 116*b* may be located in the rear section 110 or the front section 106. Each of the odometer arms 116*a* and 116*b* includes a wheel sensor that is configured to contact an inner surface of a pipeline to measure a distance traveled. The odometer arms 116*a* and 116*b* are spring-loaded to ensure contact is made with an interior of a pipeline throughout a run despite any curvature or anomalies in the pipeline.

The caliper pig 102 of FIG. 1 also includes a first cup 118 that is located between the front section 106 and the middle section 108. A second, similar cup 120 is located at the rear section 110. The cups 118 and 120 are configured to have a diameter that is less than an inner diameter of the pipeline. Together, the cups 118 and 120 provide support and alignment of the caliper pig 102 during a run through a pipeline.

The cups 118 and 120 are configured to enable the caliper pig 102 to become at least partially pressurized within a pipeline. A fluid such as gas or a liquid may be pumped in the pipeline behind the caliper pig 102. The cups 118 and 120 prevent at least some of the fluid from flowing past, thereby creating pressure. The created fluidic pressure is used to push the caliper pig 102 through a pipeline.

To measure properties of a pipeline, the caliper pig 102 includes at least one ring of caliper arms 122. In the illustrated example, the caliper pig 102 include two rings 122 and 124. A first ring 122 is located in the middle section 106 while a second ring 124 is located in the rear section 110. It should be appreciated that in other embodiments, the caliper pig 102 may include fewer rings, such as only the first ring 122.

The first ring 122 and the second 124 include arms that can out to cover a circumference of an inner surface of a pipeline. Each arm may be spring-biased to extend outward to an end of a travel length. After insertion within a pipe, the arms may be pushed downward by an inner surface of a pipeline. During movement of the caliper pig 102, each of the arms is configured to move upward or downward based on surface features of the pipeline, which a bias force of the spring is constantly pushing the arm outward. A movement sensor is connected to each arm to sense the upward and downward movement, which is referred to as caliper arm measurement data. The use of the first ring 122 and the second ring 124 provides greater resolution caliper arm measurement data, which enables precise local stress-strain calculations. The arms of the first and second rings 122 and 124 may have a circumferential resolution of about 25 mm. Further, the arms of the first and second rings 126 and 28 may have axial resolutions between 2 and 20 mm.

The caliper pig 102 also includes two support rings 126 and 128. Each of the support rings 126 and 128 includes arms with wheels at an end. The wheeled arms of the support rings 126 and 128 are configured to contact an interior of a pipeline to offload at least some of the weight of the caliper pig 102 that is put on the cups 118 and 120. This configuration helps prevent excess wear on the cups 118 and 120.

The caliper pig 102 also includes a processor 130 and a communicatively coupled memory device 132. The processor 130 may include control logic, controller, microcontroller, microprocessor, application specific integrated circuit ("ASIC"), etc. The memory device 132 may include random access memory ("RAM"), read only memory ("ROM"), flash memory, magnetic or optical disks, optical memory, or other storage media. The memory device 132 includes instructions 134, which when executed by the processor 130, cause the processor 130 to perform the operations discussed herein.

The processor 130 is also communicatively coupled to the sensors of the first ring 122 and the second ring 124 to receive caliper arm measurement data 136, which is stored to the memory device 132. The processor 130 is further communicatively coupled to the odometer wheel sensors of the odometer arms 116*a* and 116*b* to receive wheel rotation information 138, which is also stored to the memory device 132.

In some embodiments, the caliper arm measurement data 136 and the wheel rotation information 138 are stored by the processor 130 in association with each other. This association provides an axial indication as to a position of each arm relative to a location within the pipeline. For example, the wheel rotation information 138 may be sampled or partitioned at 0.1 millimeter ("mm") increments, 0.5 mm increments, 1 mm increments, 5 mm increments, 1 centimeter increments, etc. For each increment, the memory device 132 stores a position of each of the arms of the rings 122 and 124. Known distances between the rings 122 and 124 may be used by the processor 130 (or later processing) to ensure measurements for each ring correspond to the same axial location on a pipeline. The processor 130 may also be configured to compress the received caliper arm measurement data 136 and the wheel rotation information 138.

In some embodiments, the caliper pig 102 includes additional onboard sensors 140. For instance, the caliper pig 120 may include a clock for timestamping the caliper arm measurement data 136 and/or the wheel rotation information 138. Other sensors 140 may include a thermometer for recording temperature data, a pressure sensor for recording air/fluid pressure, and an inertial sensor for recording angular acceleration for providing information indicative of a spatial position of the caliper pig 102. Data from the sensors 140 is transmitted to the processor 130, which is also stored in the memory device 132.

In some embodiments, ends of the arms 122 and 124 may include current sensors 142. The example current sensors 142 include hardware for current monitoring of cathodic corrosion protection of the pipeline. Current measurements outside of a specified range may be indicative of through-holes, illegal taps, and/or hard spots. The current measurements are transmitted by the sensors 142 to the processor 130 for storage in the memory device 132.

As mentioned above, the example system 100 FIG. 1 also includes a computer 104 or a client device. The client device implies such devices as a smartphone, a tablet computer, a laptop computer, a desktop computer, a workstation, etc. The computer 104 includes a processor 150 and a memory device 152. The processor 150 executes instructions stored in the memory device to perform the operations described herein. At least some of the instructions define or specify an application 154 (e.g., an App). The example application 154 is configured to execute a machine learning model 156 to classify pipeline features using the caliper arm measurement data 136, the wheel rotation information 138, and the data from the sensors 140 and 142.

In the illustrated example, the application 154 is configured to receive the caliper arm measurement data 136, the wheel rotation information 138, and the data from the sensors 140 and 142 after the caliper pig 102 has finished an inspection run. The application 154 may be configured to communicate with the processor 130, via the transmitter 114 for example, for establishing a communication connection and transmitting the caliper arm measurement data 136, the wheel rotation information 138, and the data from the sensors 140 and 142. The application 154 may store the received data to a log or run file in the memory device 152. In some embodiments, the connection with the processor 130 is wireless, such as via a Bluetooth® or Zigbee® connection. In other embodiments, the connection is wired, such as a universal serial bus ("USB"), a serial connection, and/or an Ethernet connection. In yet other embodiments, the caliper arm measurement data 136, the wheel rotation information 138, and the data from the sensors 140 and 142 may be transferred manually via an USB stick or flash memory card.

In the illustrated example, the application 154 is configured to prompt an operator to confirm that the received caliper arm measurement data 136, the wheel rotation information 138, and the data from the sensors 140 and 142 should be analyzed. After confirmation, the application 154 is configured to process the caliper arm measurement data 136, the wheel rotation information 138, and the data from the sensors 140 and 142 through the machine learning model 156 to generate one or more electronic reports 158. As discussed below, the electronic reports 158 may identify pipeline features including deposits, buckles, dents, a presence of an ovality, a presence of offtakes, a presence of fixtures, a presence of tees, a presence of valves, bends, diameter changes, wall thickness changes, a presence of through-holes, a presence of stress/strain zones, and/or hard spots. In some embodiments, the machine learning model is trained with classifiers for identifying each of the feature types. In addition to identifying pipeline features, the machine learning model 156 is configured to identify for the report 158 attributes for each pipeline feature, an axial position, an angular position, linear dimensions and/or a size/depth/ovality.

In some embodiments, the report 158 may include a three-dimensional model or representation of the pipeline that is created using the caliper arm measurement data 136, the wheel rotation information 138, and the data from the sensors 140 and 142 in conjunction with the feature identification/classification. The machine learning model 156 in some instances may highlight or otherwise flag or tag identified pipeline features in the three-dimensional model and/or report 158. The machine learning model 156 in conjunction with the application 154 on the computer 104 is configured to provide a near real-time assessment of a pipeline shortly after the caliper pig 102 has finished an in-line inspection run.

The example pipeline inspection system 100 of FIG. 1 may also include a network 160 and a third-party server 162. The network 160 includes any wireless and/or wired local area network, wide area network (e.g., the Internet), any cellular network, or combinations thereof. The third-party server 162 is configured to train and/or validate the machine learning model 156 before deployment. After the model is ready, the third-party server 162 is configured to transmit the model 156 to the computer 104. In some embodiments, the third-party server 162 may use updates to training data to further train and update the model 156. Further, the computer 104 may be configured to transmit the reports and/or the three-dimensional model of the pipeline to the third-party server 162.

Figure 2:
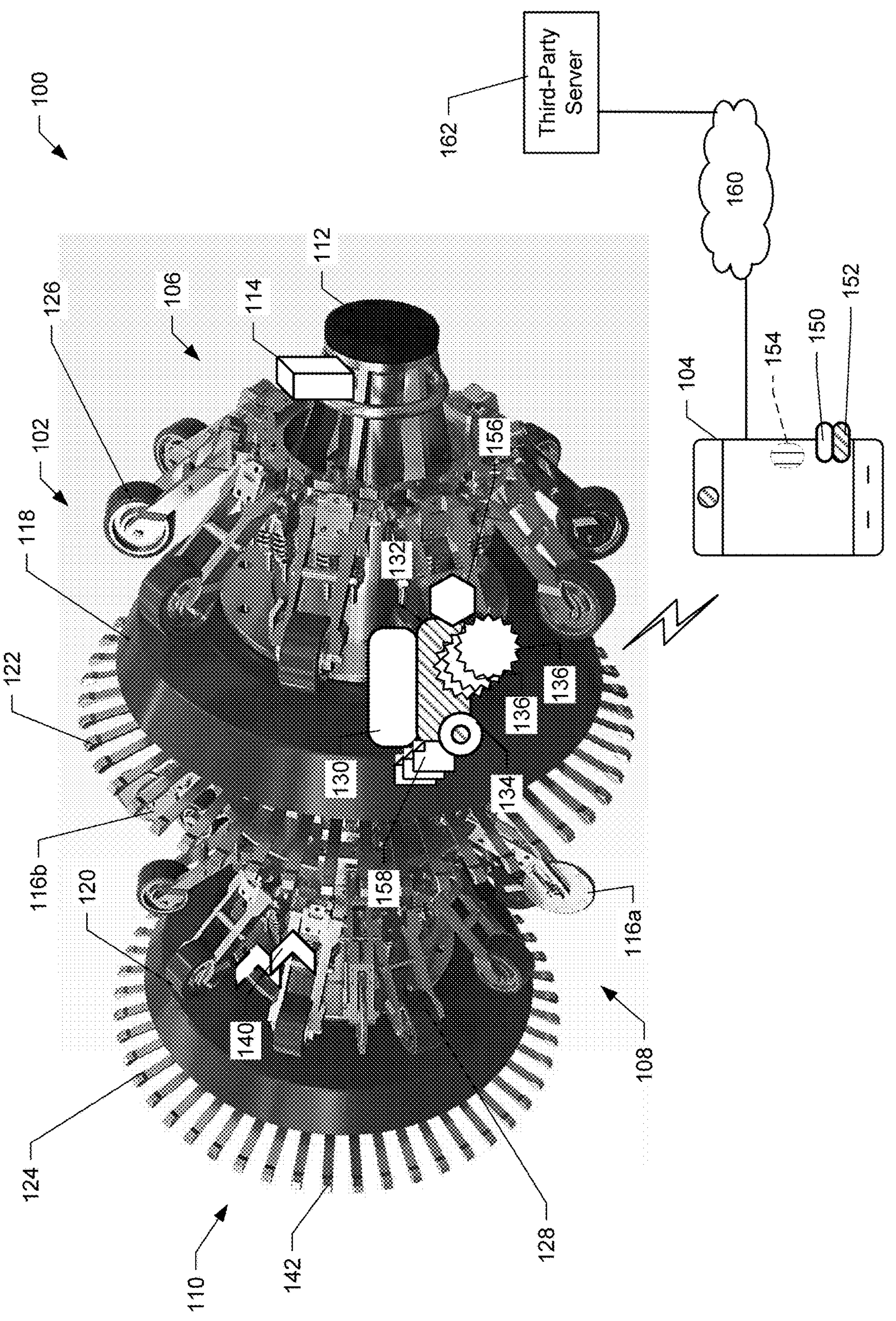
FIG. 2 is an alternative embodiment of the pipeline inspection system of FIG. 1, according to an example embodiment of the present disclosure.

FIG. 2 is an alternative embodiment of the pipeline inspection system 100 of FIG. 1, according to an example embodiment of the present disclosure. In the illustrated embodiment, the machine learning model 156 is stored at the memory device 132 of the caliper pig 102. The processor 130 of the caliper pig 102 is configured to locally operate the machine learning model 156 during and/or after a run. For example, the processor 130 may be configured to apply the caliper arm measurement data 136, the wheel rotation information 138, and the data from the sensors 140 and 142 to the machine learning model 156 within a specified number of seconds after the data is received. For example, the caliper arm measurement data 136, the wheel rotation information 138, and the data from the sensors 140 and 142 may be applied to the machine learning model 156 within sixty seconds of being received such that pipeline features are identified in real-time. In this configuration, potentially dangerous pipeline features are identified immediately after an inspection, enabling an operator to correct quick corrective action. Alternatively, the processor 130 may receive an indication that an inspection run has ended and then apply the caliper arm measurement data 136, the wheel rotation information 138, and the data from the sensors 140 and 142 to the machine learning model 156.

The machine learning model 156 generates a report 158 and/or three-dimensional model locally, which is stored to the memory device 132. The processor 130 may then transmit the report 158 and/or the three-dimensional model to the computer 104 for viewing after a connection is made. The processor 130 may also transmit the caliper arm measurement data 136, the wheel rotation information 138, and the data from the sensors 140 and 142 with the report 158 and/or the three-dimensional model.

Figure 3:
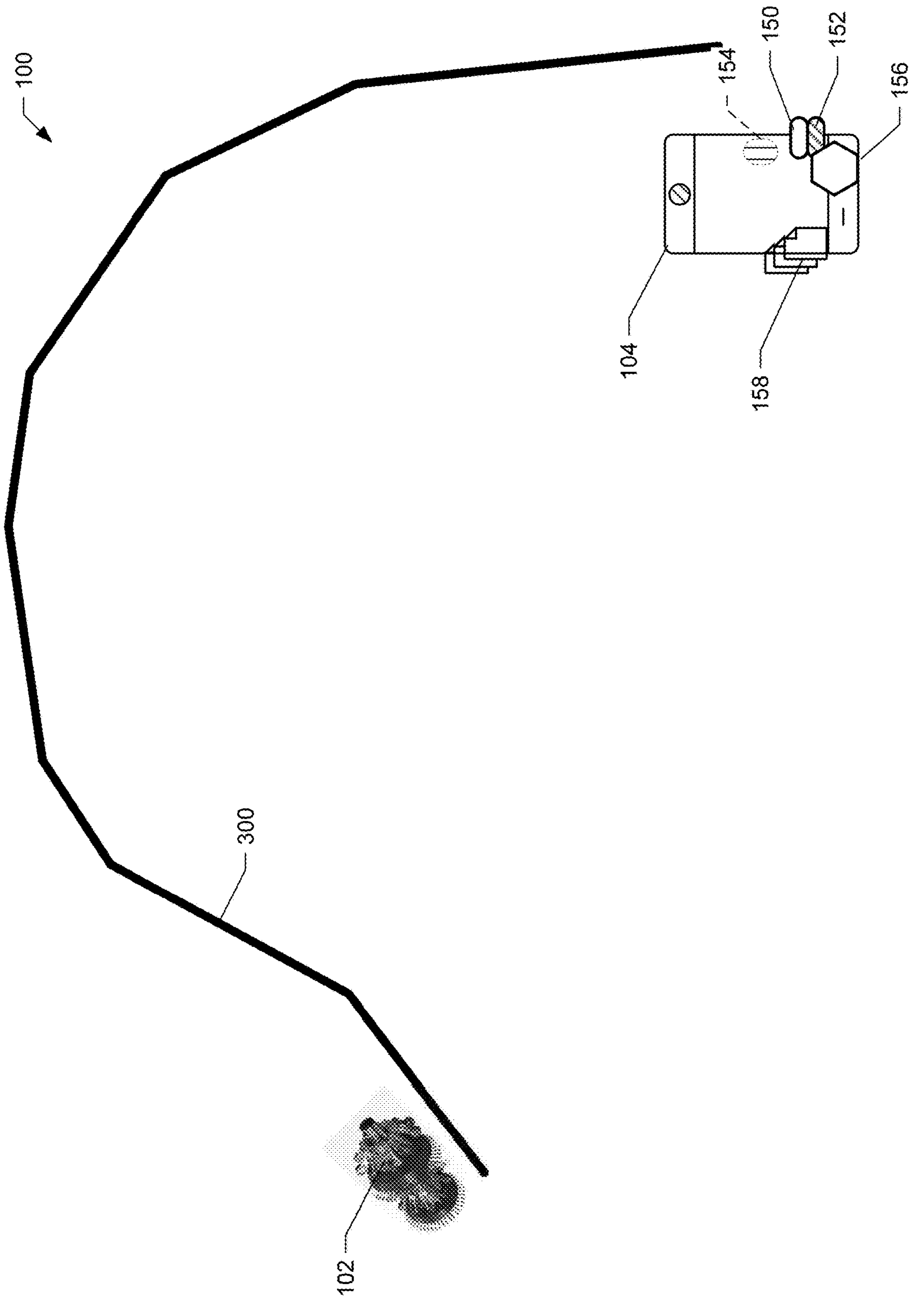
FIG. 3 is a diagram of the pipeline inspection system of FIG. 1 showing an in-line inspection run of the caliper pig, according to an example embodiment of the present disclosure.

FIG. 3 is a diagram of the pipeline inspection system 100 showing an in-line run of the caliper pig 102 of FIG. 1, according to an example embodiment of the present disclosure. In this example, the caliper pig 102 is inserted into a first end of a pipeline 300. Fluid is then inserted into the first end, pushing the caliper pig 102 through the pipeline 300. The caliper arm measurement data 136, the wheel rotation information 138, and the data from the sensors 140 and 142 is recorded locally by the processor 130 of the caliper pig 102 during the run. The caliper pig 102 may be pushed through the pipeline 300 at a rate between 0.1 to 5 meters per second. After some time, the caliper pig 102 reaches an end of the pipeline 300. At this point, the processor 130 transmits the caliper arm measurement data 136, the wheel rotation information 138, and the data from the sensors 140 and 142 to the computer 104 for processing through the machine learning model 156 to automatically identify pipeline features.

Machine Learning Model Embodiment

Figure 4:
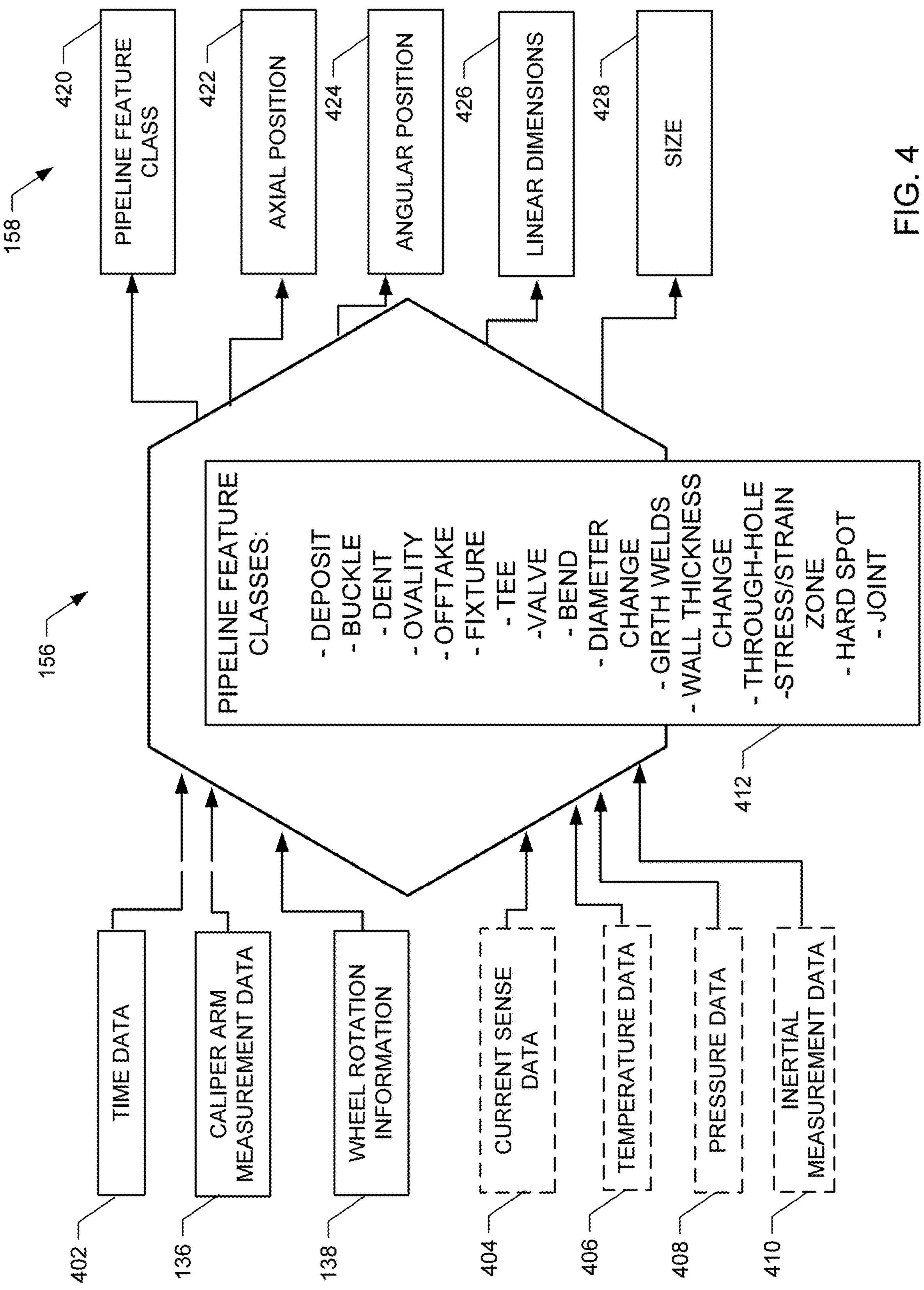
FIG. 4 is a diagram of a machine learning model of FIGS. 1 and 2, according to an example embodiment of the present disclosure.

As discussed above, the machine learning model 156 is configured to use the caliper arm measurement data 136, the wheel rotation information 138, and the data from the sensors 140 and 142 to identify pipeline features. FIG. 4 is a diagram of the machine learning model 156 of FIGS. 1 and 2, according to an example embodiment of the present disclosure. In the illustrated example, the machine learning model 156 receives caliper arm measurement data 136 and wheel rotation information 138, which specifies how much each caliper arm of the caliper pig 102 moved at each sample point or location along a pipeline. The machine learning model 156 may also receive time data 402 generated by a clock of the processor 130. The time data 402, when used with the wheel rotation information 158, provides an indication of how quickly the caliper pig 102 was moving through a pipeline when the caliper arm measurement data 136 was recorded. In some embodiments, caliper arm measurement data 136 recorded when the caliper pig 102 was moving relatively quickly (e.g., over one meter per second), may be analyzed for quality control.

Figure 7:
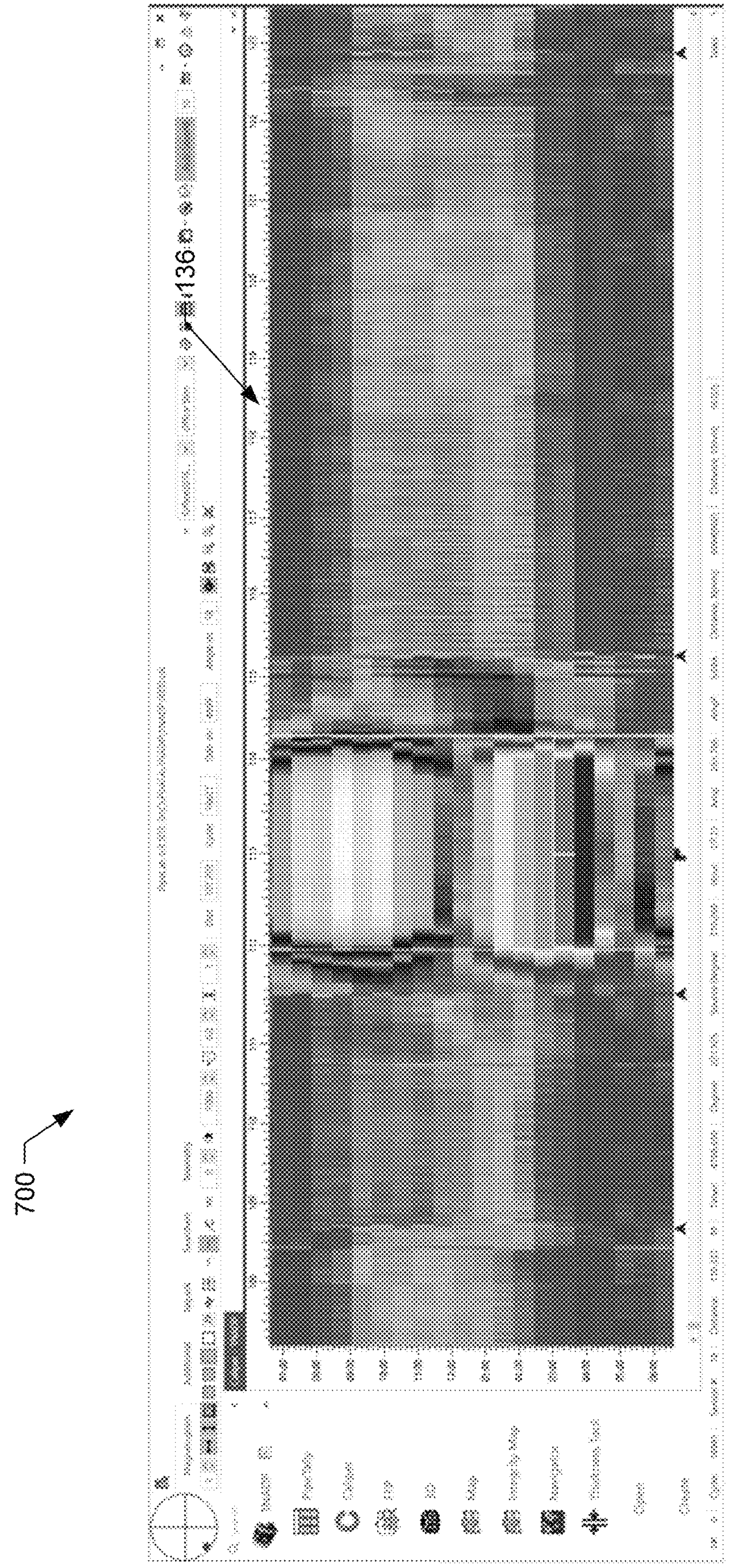
FIGS. 7 to 10 are diagrams of caliper arm measurement data used by the machine learning model of FIG. 4 to automatically identify and classify pipeline features, according to an example embodiment of the present disclosure.

FIG. 7 is a graph 700 of the caliper arm measurement data 136 for wheel rotations between 107 and 123 meters for a pipeline under inspection, according to an example embodiment of the present disclosure. The caliper arm measurement data 136 is projected to a flat two-dimensional graph to represent the three-dimensional interior curvature of the pipeline. Sensor data from each movement senor is combined together to provide a near-continuous measurement of an interior of a pipeline. In the illustrated example, color-coding is used to represent inward and outward movement of the sensors from an average position. In this example, the deviation corresponds to a bend in the pipeline. The color coding corresponds to numerical values regarding how much the pipeline section extends inwards or is pushed outwards from the average pipeline cross-sectional area.

Figure 8:
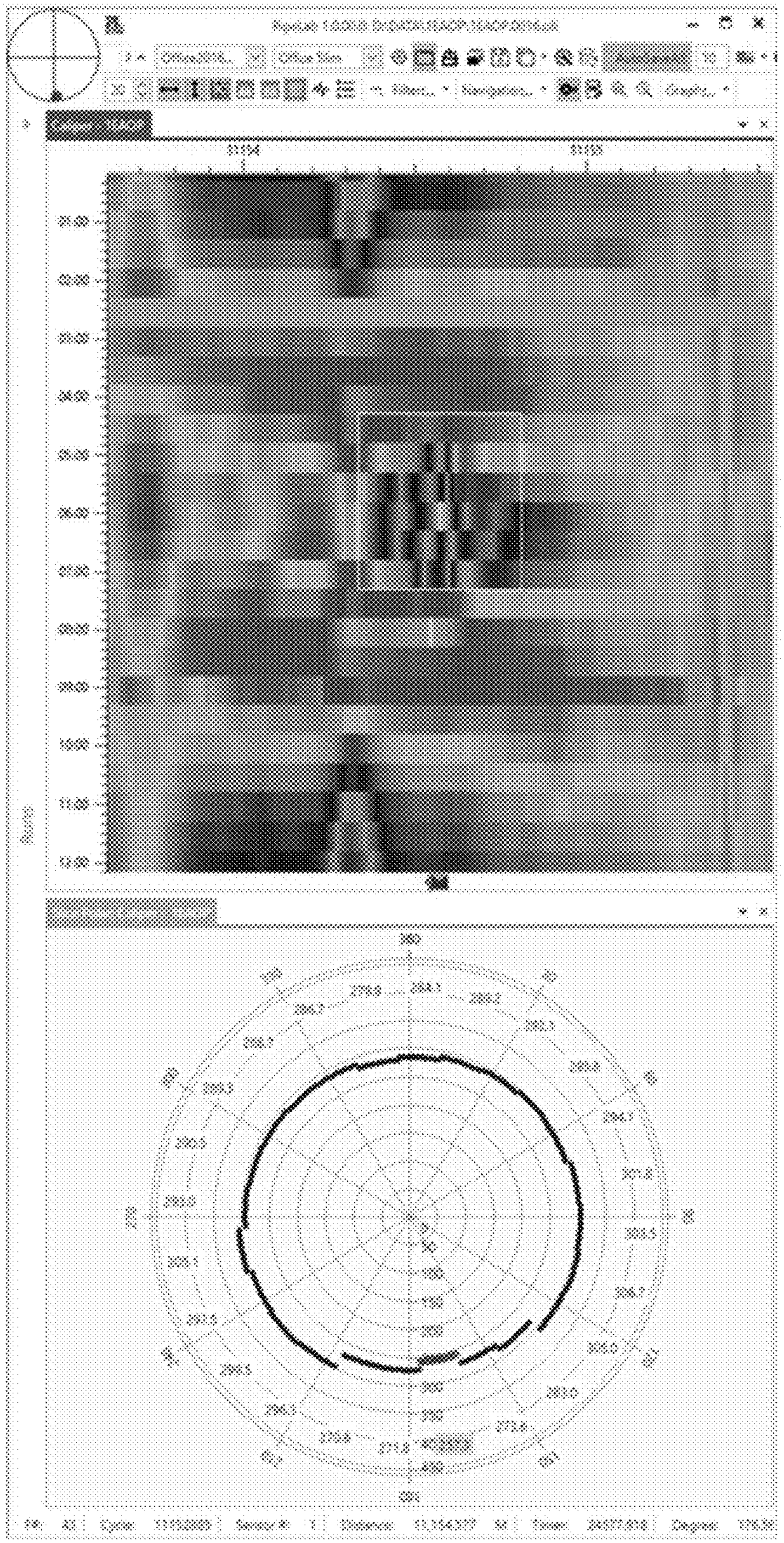
Figure 9:
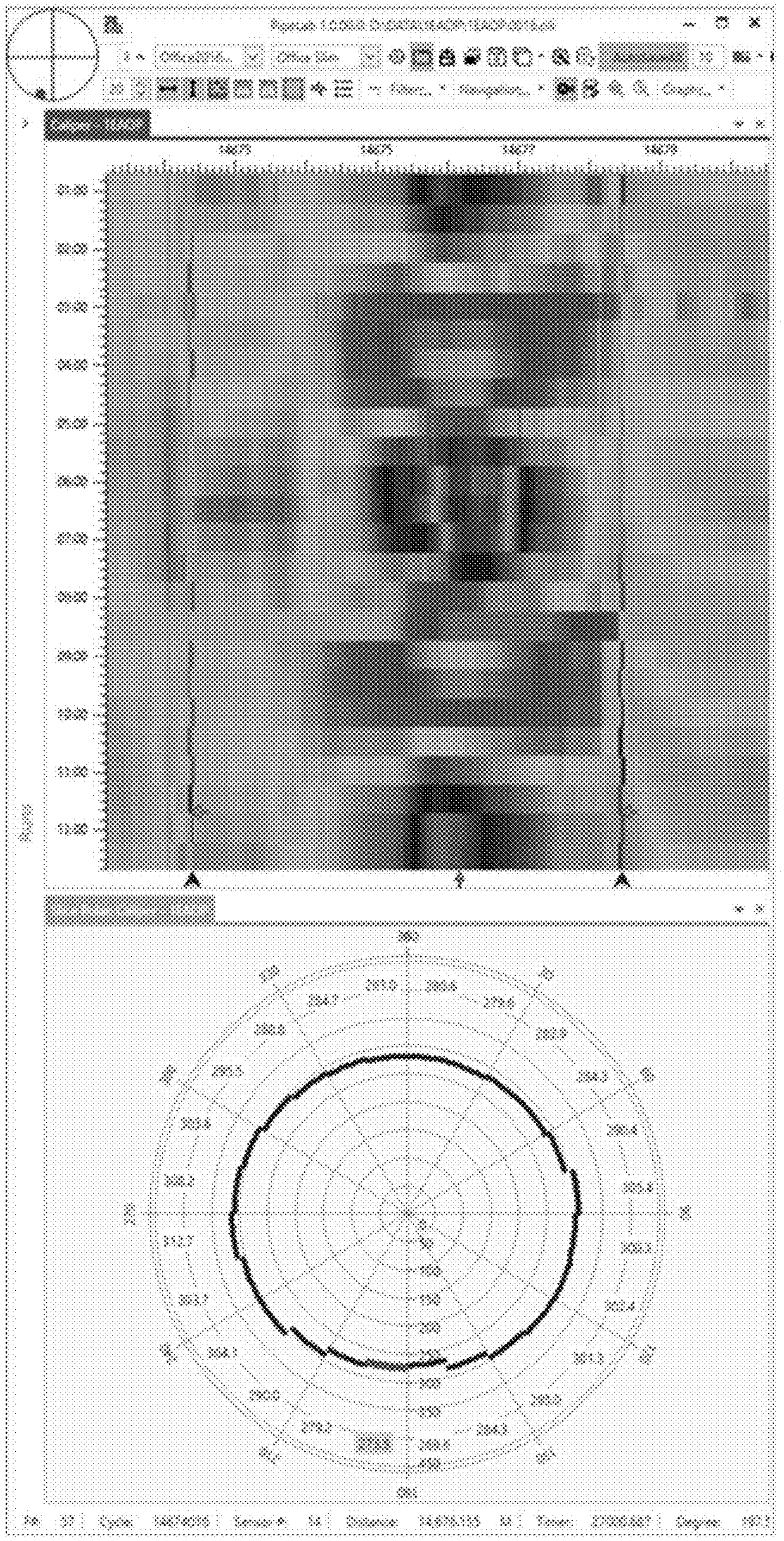
Figure 10:
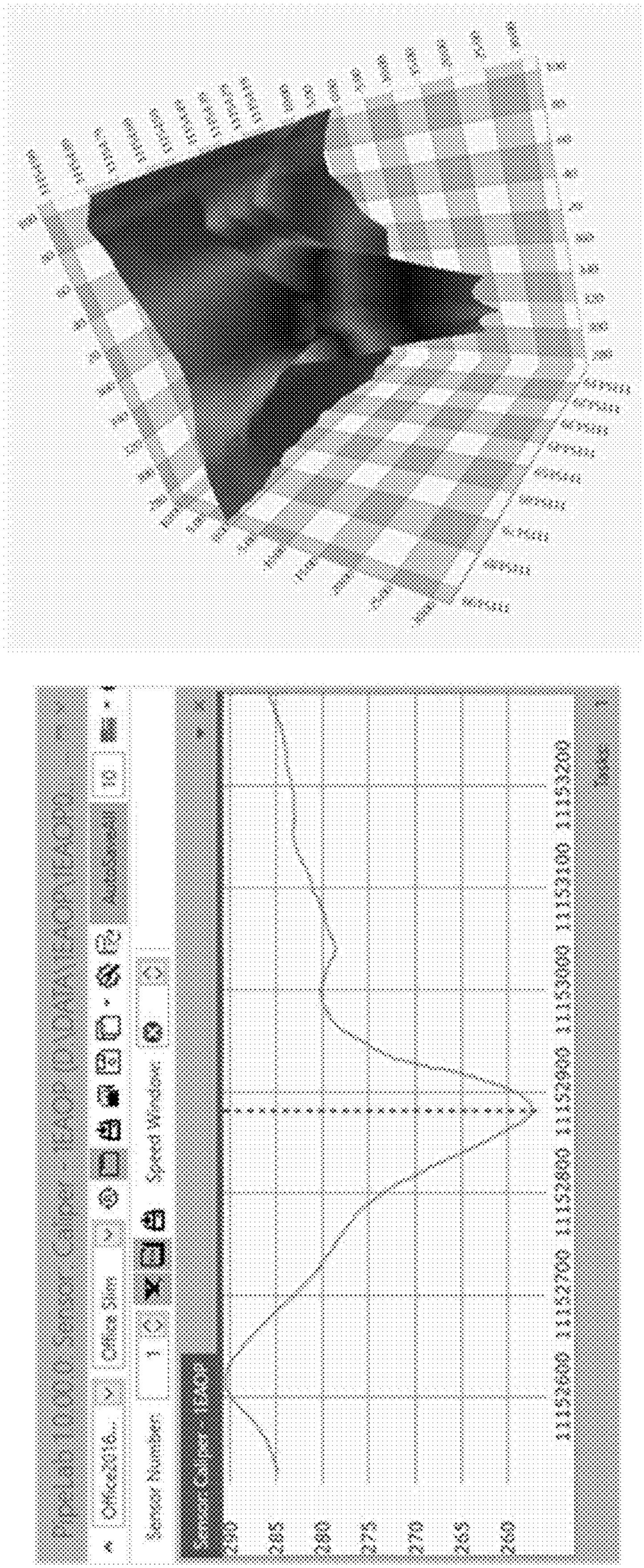

FIGS. 8 and 9 show graphs 800 and 900 of the caliper arm measurement data 136 in addition to cross-sectional representations of the pipeline in the areas of defects, according to example embodiments of the present disclosure. The graph 800 shows a dent while the graph 900 shows ovality. FIG. 10 shows graphs 1000 of the dent of graph 800 in an axial projection and a three-dimensional view, according to an example embodiment of the present disclosure. The data in the graphs 700 to 1000 may be indexed to an identified pipeline feature to enable an operator to view further information in relation to the report 158, discussed below.

The machine learning model 156 may also receive current sense data 404, temperature data 406, pressure data 408, and/or inertial measurement data (e.g., angular acceleration data) 410 from the respective sensors 140 and 142. The machine learning model 156 may include one or more neural networks that processes the data 156, 158, and 402 to 410 to determine favorable comparisons to already identified pipeline features. In some embodiments, YOLOv5 may be used for pipeline feature detection while ResNet34 and Inception V4 are used for feature classification. When different machine learning algorithms are used together, the machine learning model 156 may use a voting function or cascade the algorithms together to converge upon a most likely pipeline feature. The machine learning model 156 includes defined pipeline feature classes 412 that define data weights and bounds to characterize certain of the data 156, 158, and 402 to 410 as corresponding to a most likely pipeline feature. As shown in FIG. 4, the feature classes 412 include at least one of a deposit, a buckle, a dent, a presence of an ovality, a presence of an offtake, a presence of a fixture, a presence of a tee, a presence of a valves, a bend, a diameter change, a wall thickness change, a presence of a through-hole, a presence of a stress/strain zone, a presence of a (girth) weld, and/or a hard spot. Other examples may include fewer or additional feature classes.

It should be appreciated that certain data 156, 158, and 402 to 410 may correlate more closely to certain pipeline features. For example, the current sense data 404 provides a strong indication of hard spots, through-holes, and stress-strain zones. In other embodiments, certain caliper arm measurement data 136 may be indicative of bends, dents, and buckles.

For each identified pipeline feature, the machine learning model 156 is configured to specify the class of type 420. The machine learning model 156 also uses the caliper arm measurement data 136 and the wheel rotation information 138 to determine an axial position 422 along the pipeline. The axial position 422 corresponds to a distance along a pipeline from an origin at a start of an inspection. The axial position 422 specifies where a pipeline operator is to travel to along a pipeline to locate the specified pipeline feature.

The machine learning model 156 also uses the caliper arm measurement data 136 and the wheel rotation information 138 to determine an angular position 424. The angular position 424 specifies a position along a circumference of an inside of a pipeline at which a pipeline feature is located. The angular position 424 may be important for smaller pipeline features that may not be readily apparent from initial visual inspection.

The machine learning model 156 also uses the caliper arm measurement data 136 and the wheel rotation information 138 to determine linear dimensions 426 and/or a size 428 of the pipeline feature. To determine the dimensions 426 and size 428, the machine learning model 156 uses the caliper arm measurement data 136 and the wheel rotation information 138 to determine portions of a pipeline that have deviations grouped together. The common group of deviations is classified as a single feature. The machine learning model 156 applies a ruler function to measure dimensions and a size of the grouped deviations.

Figure 5:
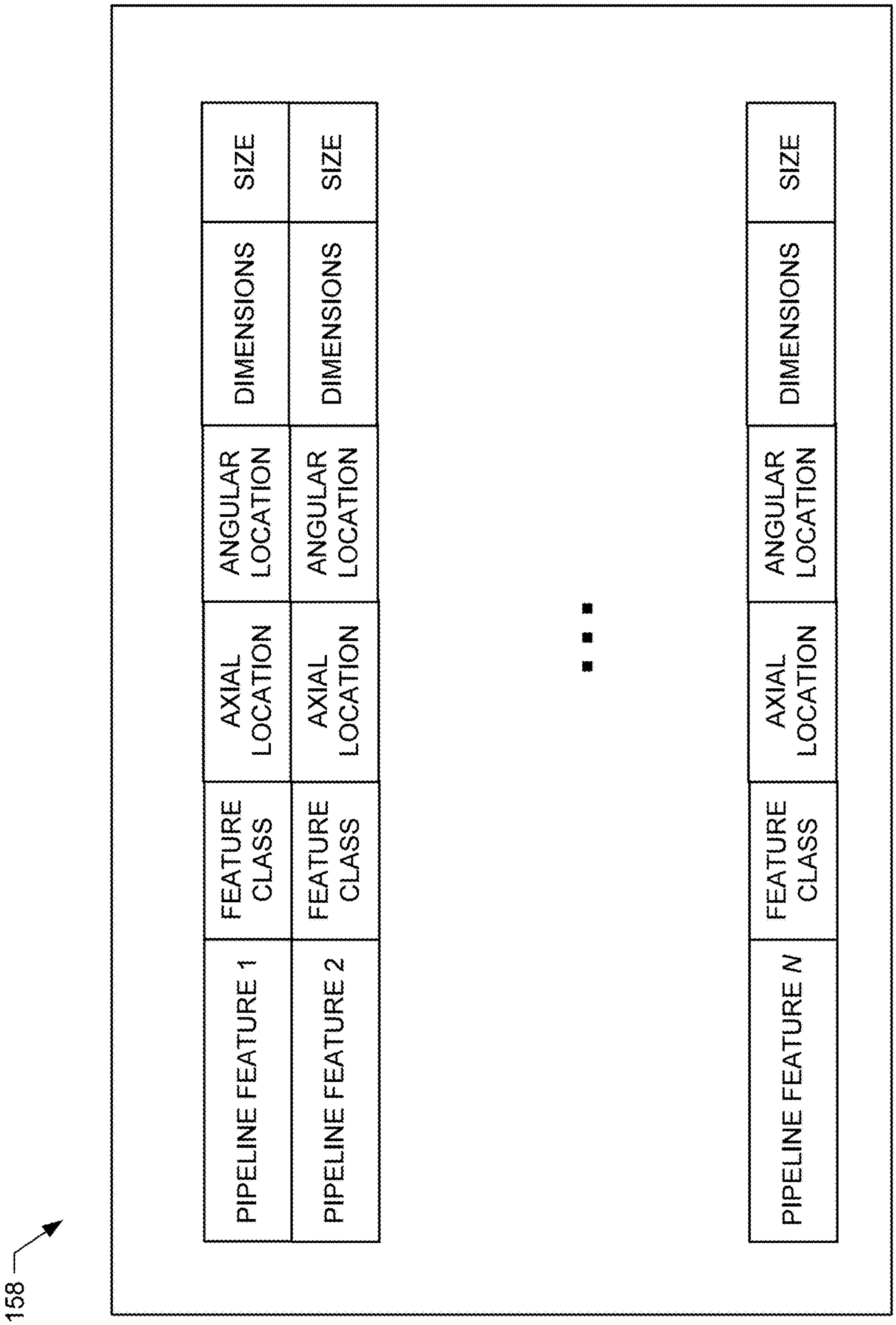
FIG. 5 is a diagram of an example report specifying identified pipeline features, according to an example embodiment of the present disclosure.

Together, the feature class 420, the axial position 422, the angular position 424, the dimensions 426, and the size 428 are generated into the electronic report 156. FIG. 5 is a diagram of an example report 158 specifying identified pipeline features, according to an example embodiment of the present disclosure. In the example, the report 158 includes each identified pipeline feature including the feature class 420, the axial position 422, the angular position 424, the dimensions 426, and the size 428. Such a report 158 may be easily viewed by a pipeline operator to identify areas of concern for subsequent follow up.

Figure 6:
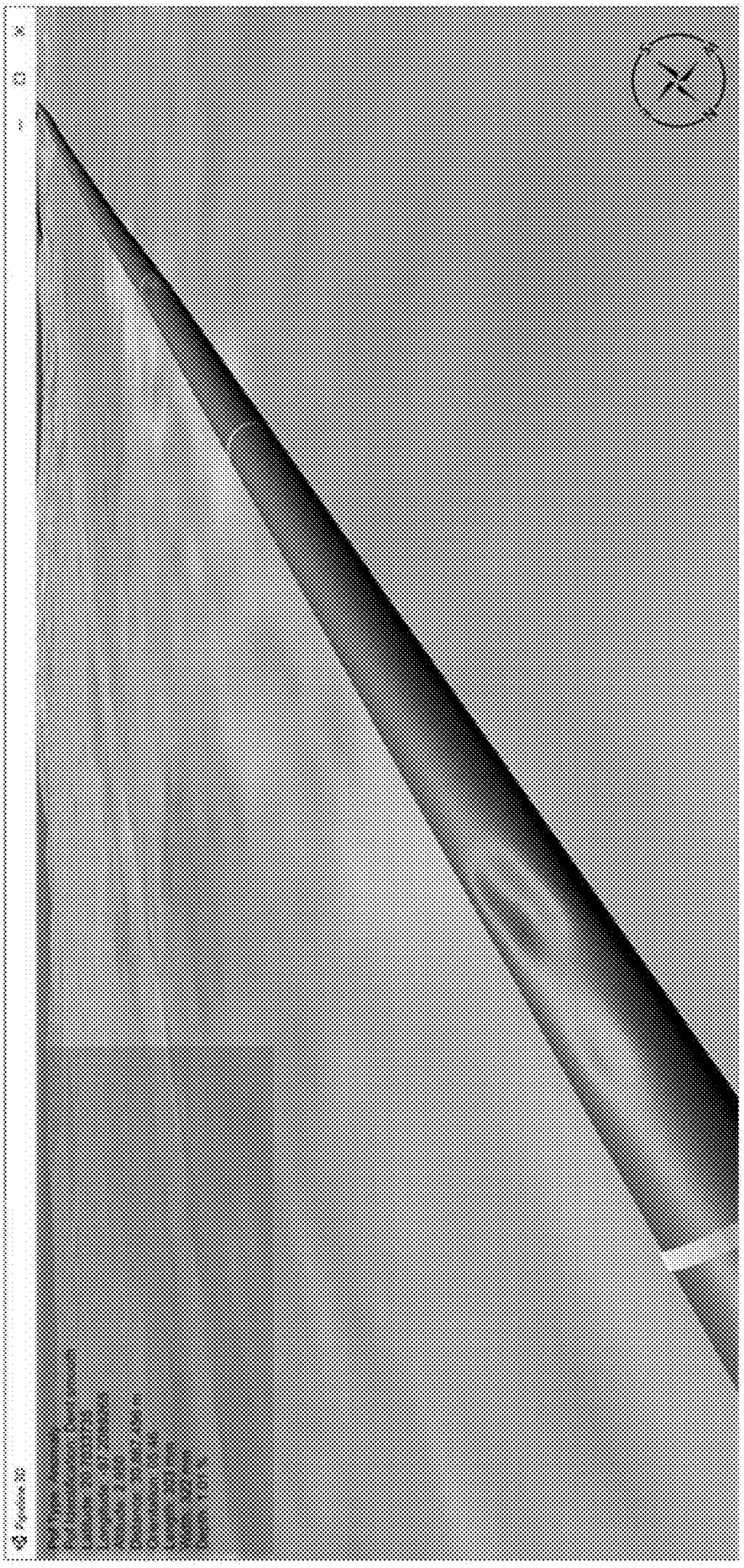
FIG. 6 is a diagram of a three-dimensional model of an inspected pipeline generated by the machine learning model of FIG. 4, according to an example embodiment of the present disclosure.

The example machine learning model 156 may also generate a three-dimensional model of the pipeline under inspection. FIG. 6 is a diagram of a three-dimensional model 600 of an inspected pipeline generated by the machine learning model 156, according to an example embodiment of the present disclosure. The machine learning model 156 uses the caliper arm measurement data 136 and the wheel rotation information 138 in conjunction with the data from the report 158 to create the model 600. The machine learning model 156 uses the class of the pipeline feature to represent the pipeline feature, which is shown based on the determined dimensions and/or size. The machine learning model 156 may add structure to show tees, valves, offtakes, stress/strain zones, welds, and/or hot spots, which may not be readily observable from the caliper arm measurement data 136 itself. In some embodiments, the machine learning model 156 may highlight or tag the pipeline features on the three-dimensional model 600 to ensure they are viewable to an operator. Selection of a feature on the model 600 may cause the machine learning model 156 to display the corresponding data from the report 158, including size, dimensions, angle, and axial position.

Figure 11:
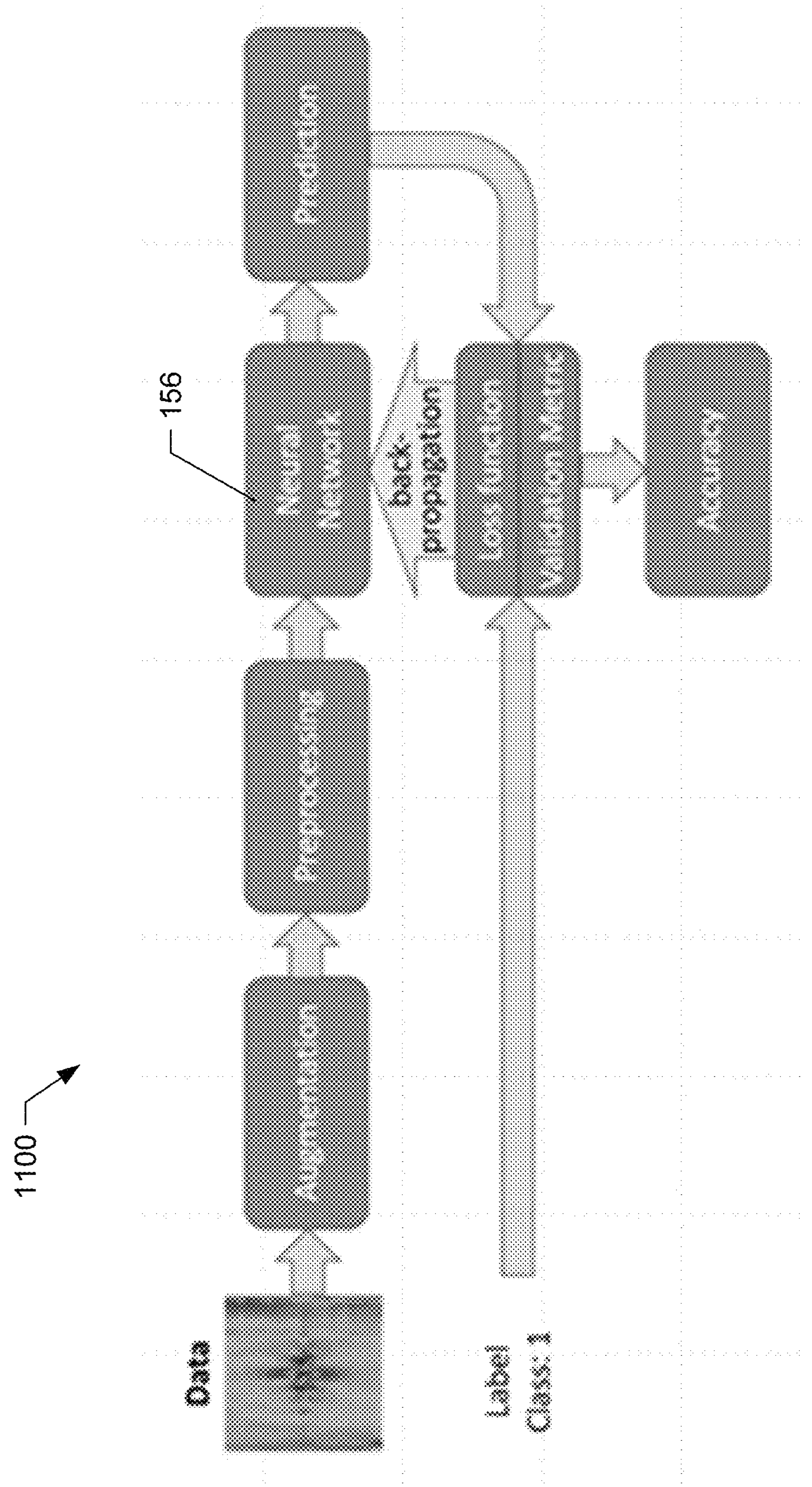
FIG. 11 is a diagram of an example process for training the machine learning model of FIG. 4, according to an example embodiment of the present disclosure.

The machine learning model 156 is trained and validated using caliper arm measurement data 136 that is labeled with a known pipeline feature. FIG. 11 is a diagram of an example process 1100 for training the machine learning model 156, according to an example embodiment of the present disclosure. For training, the process 1100 begins when caliper arm measurement data 136 and wheel rotation information 138 is received. The data 402 to 410 may also be received. The data 136, 138, and 402 to 410 is augmented and pre-processed before passing through one or more neural networks. A prediction from the data is compared to a known class type of a pipeline feature. In some embodiments, 5000 samples of each class type are used for training. The comparison provides a validation metric and loss function, which is applied to the one or more neural networks such that areas of favorable comparison are reinforced and areas of negative comparison are negatively correlated or un-correlated. The process 1100 may generate an accuracy metric to indicate when the neural networks are appropriately trained.

In some embodiments, the data 136, 138, and/or 402 to 410 may be analyze to identify pipe joints. This enables the machine learning model 156 to identify pipe joints in the report 158 and/or the three-dimensional model 600. Other pipeline features may still be present and identified by the machine learning model 156 at the locations of joints, such as bends.

Figure 12:
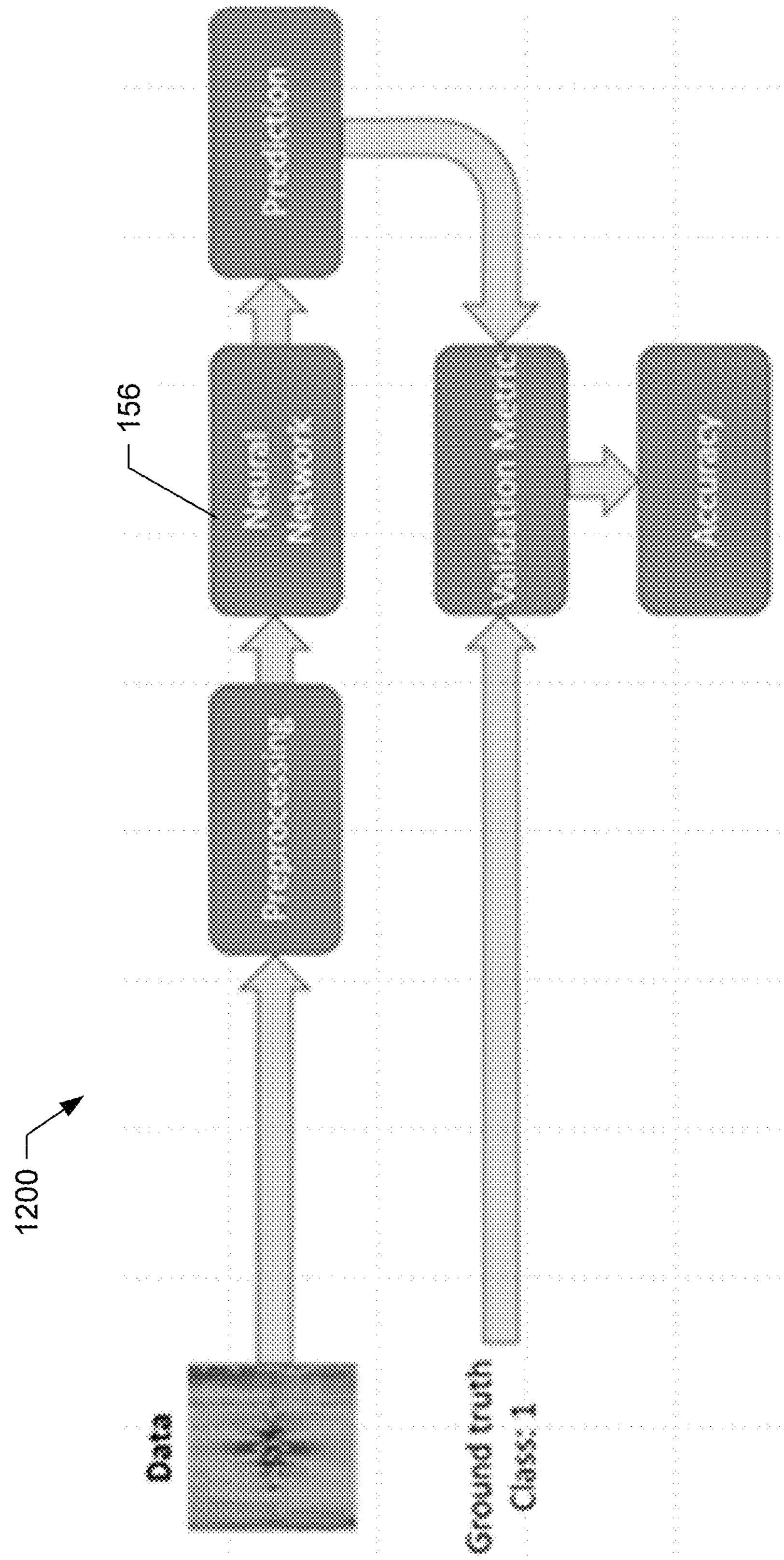
FIG. 12 is a diagram of an example process for validating the machine learning model of FIG. 4, according to an example embodiment of the present disclosure.

FIG. 12 is a diagram of a process 1200 for validating the machine learning model 156, according to an example embodiment of the present disclosure. For validation a new set of data 136, 138, and/or 402 to 410 is obtained. The data 136, 138, and/or 402 to 410 is preprocessed and input into the machine learning model 156. A prediction output for pipeline feature class is compared to a known ground truth for the data to generate a validation metric. The process 1200 continues as further data 136, 138, and/or 402 to 410 is processed and the validation metrics are compiled to generate an accuracy result. The machine learning model 156 is deployed to one or more computers 104 when the accuracy is above a sufficient threshold, such as 80%, 85%, 90%, 95%, 99%, etc.

Figure 13:
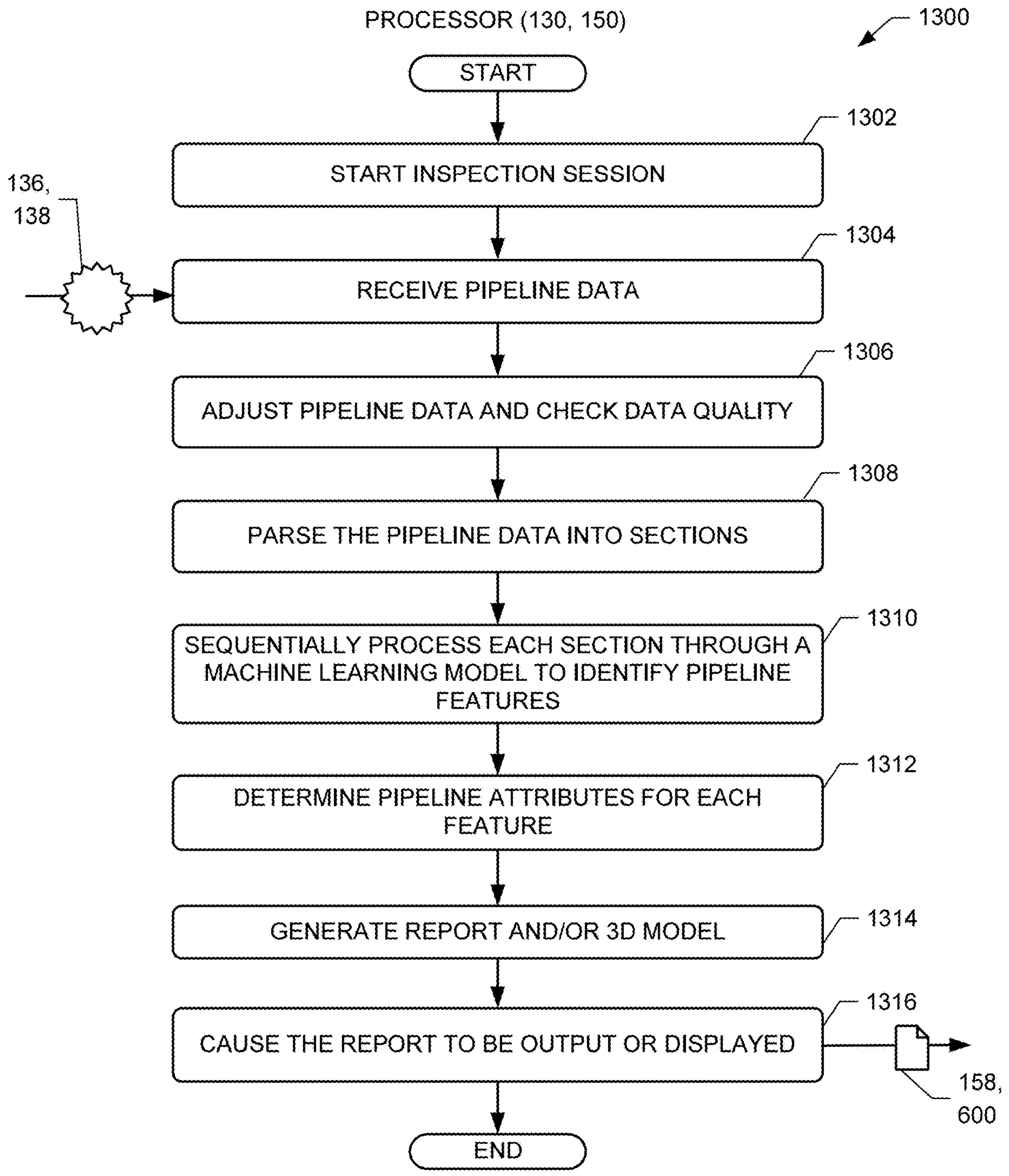
FIG. 13 is a flow diagram of an example procedure to automatically identify pipeline features using the machine learning model of FIG. 4, according to an example embodiment of the present disclosure.

FIG. 13 is a flow diagram of an example procedure 1300 to automatically identify pipeline features using the machine learning model 156, according to an example embodiment of the present disclosure. Although the procedure 1300 is described with reference to the flow diagram illustrated in FIG. 13, it should be appreciated that many other methods of performing the steps associated with the procedure 1300 may be used. For example, the order of many of the blocks may be changed, certain blocks may be combined with other blocks, and many of the blocks described may be optional. In an embodiment, the number of blocks may be changed based on use of the machine learning model 156. The actions described in the procedure 1300 are specified by one or more instructions and may be performed among multiple devices including, for example the computer 104 and/or the processor 130 of the caliper pig 102.

The example procedure 1300 begins when a caliper pig 102 is inserted into a pipeline and an inspection session is started (block 1302). A processor the caliper pig 102 receives, stores, and/or compresses caliper arm measurement data 136, wheel rotation information 138, and the data from the sensors 140 and 142 (block 1304). After the pipeline inspection run has concluded, the stored caliper arm measurement data 136, the wheel rotation information 138, and the data from the sensors 140 and 142 is transferred to the computer 104 for processing (block 1306). As part of this step, the computer 104 may make data adjustments and/or check data quality. In an example, the machine learning model 156 on the computer 104 (or the processor 130) may use the caliper arm measurement data 136, the wheel rotation information 138, and the data from the sensors 140 and 142 to identify pipeline joints. The machine learning model 156 on the computer 104 (or the processor 130) may then use at least one of the determined pipeline joint lengths, time measurements from a clock, and angular acceleration data from at least one inertial measurement unit to check data quality of the caliper arm measurement data that was acquired at high speed areas of the caliper pig 102 while inspecting the pipeline. Further, the machine learning model 156 on the computer 104 (or the processor 130) uses the determined pipeline joint lengths to classify corresponding caliper arm measurement data as a pipeline joint.

The example machine learning model 156 is configured to parse the caliper arm measurement data 136, the wheel rotation information 138, and the data from the sensors 140 and 142 into different pipeline sections (block 1308). The sections may be overlapping or non-overlapping. The machine learning model 156 then processes the caliper arm measurement data 136, the wheel rotation information 138, and the data from the sensors 140 and 142 for each section to determine if a pipeline feature is present (block 1310). If a feature is present, the machine learning model 156 determines a class type of the feature. The machine learning model 156 also determines an axial position 422, an angular position 424, dimensions 426, and/or a size of the identified pipeline feature (block 1312). The machine learning model 156 then generates a report 158 and/or a three-dimensional model 600 based on the identified and classified pipeline features (block 1314). The machine learning model 156 next causes the report 158 and/or the three-dimensional model 600 to be displayed for a pipeline operator (block 1316). The example procedure 1300 then ends.

Conclusion

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A system for inspecting pipelines, the system including:
a caliper pig having a front section, a middle section, and a rear section, the caliper pig including:
a bumper located at the front section and configured to form a leading surface through a pipeline,
at least two spring-supported odometer arms located at the middle section or the front section, each odometer arm including a wheel sensor configured to contact an inner surface of the pipeline for measuring a distance traveled,
a first cup located between the front section and the middle section, the first cup configured to have a diameter that is less than an inner diameter of the pipeline,
a second cup located at the rear section, the second cup configured to have a diameter that is less than the inner diameter of the pipeline,
a ring of caliper arms located in the middle section, the ring configured to cover a circumference of the inner surface of the pipeline, each caliper arm configured to move upward and downward to measure surface features of the pipeline and including a movement sensor to detect upward and downward movement of the caliper arm,
a transmitter configured to transmit a wireless signal to enable locating the caliper pig,
a memory device, and
a processor communicatively coupled to the movement sensors and the memory device, the processor configured to:
store wheel rotation information from the odometer wheel sensors to the memory device, and
store caliper arm measurement data for each of the caliper arms to the memory device in association with the wheel rotation information; and
a computer including a machine learning model configured to:
receive the wheel rotation information and the caliper arm measurement data from the processor of the caliper pig,
combine the caliper arm measurement data for the different caliper arms that correspond to the same wheel rotation information,
parse the caliper arm measurement data into separate pipeline sections based on the wheel rotation information, and
sequentially process each pipeline section using the machine learning model to detect pipeline features, assign a feature class to each pipeline feature, and determine an axial position, an angular position, linear dimensions, and a size for each pipeline feature.

2. The system of claim 1, wherein the computer is communicatively coupled to the processor via at least one of a wired connection or a wireless connection.

3. The system of claim 1, wherein the computer is integrated with the processor.

4. The system of claim 1, wherein each of the caliper arms includes a current sensor configured to detect a current within the pipeline and generate current sense data, and
wherein the processor is configured to store the current sense data to the memory device in conjunction with the caliper arm measurement data.

5. The system of claim 4, wherein the machine learning model is configured to additionally use the current sense data to detect pipeline features and assign the feature class to each pipeline feature.

6. The system of claim 1, wherein the caliper pig further includes at least one of a clock configured to generate time data, a temperature sensor configured to generate temperature data, a pressure sensor configured to generate pressure data, or an inertial measurement unit configured to generate angular acceleration data.

7. The system of claim 6, wherein the processor is configured to store the at least one of the time data, the temperature data, the pressure data, or the angular acceleration data to the memory device in conjunction with the caliper arm measurement data.

8. The system of claim 7, wherein the machine learning model is configured to additionally use the at least one of the time data, the temperature data, the pressure data, or the angular acceleration data to detect pipeline features and assign the feature class to each pipeline feature.

9. The system of claim 1, wherein the machine learning model is configured to use the caliper arm measurement data to determine pipeline joint lengths.

10. The system of claim 9, wherein at least one of the computer or the machine learning model is configured to use at least one of the pipeline joint lengths, time measurements from a clock, and angular acceleration data from at least one inertial measurement unit to check data quality of the caliper arm measurement data that was acquired at high speed areas of the caliper pig while inspecting the pipeline.

11. The system of claim 9, wherein at least one of the computer or the machine learning model is configured to use the pipeline joint lengths to classify corresponding caliper arm measurement data as a pipeline joint.

12. The system of claim 1, wherein at least one of the computer or the machine learning model is configured to create an electronic report that includes the pipeline features specifying the feature class, the axial position, the angular position, the linear dimensions, and the size.

13. The system of claim 12, wherein at least one of the computer or the machine learning model is configured to cause the electronic report to be displayed to transmit the electronic report to a client device for display.

14. The system of claim 1, wherein at least one of the computer or the machine learning model is configured to generate a three-dimensional model of the pipeline using the pipeline features specifying the feature class, the axial position, the angular position, the linear dimensions, and the size.

15. The system of claim 14, wherein at least one of the computer or the machine learning model is configured to highlight or tag the pipeline features on the three-dimensional model.

16. The system of claim 1, wherein the feature class includes at least one of a deposit, a buckle, a dent, a presence of an ovality, a presence of an offtake, a presence of a fixture, a presence of a tee, a presence of a valve, a bend, a diameter change, a wall thickness change, a presence of a through-hole, a presence of a stress/strain zone, a presence of a weld, and a hard spot.

17. The system of claim 1, wherein the ring of caliper arms is a first ring of caliper arms, the caliper pig including a second ring of caliper arms located at the rear section, each caliper arm of the second ring of caliper arms configured to move upward and downward to measure surface features of the pipeline and including a movement sensor to detect upward and downward movement of the caliper arm.

18. The system of claim 1, further comprising at least one support ring located at the front section or the middle section, the at least one support ring including wheeled arms for supporting the caliper pig.

19. A system for inspecting pipelines, the system including:

a memory device storing machine-readable instructions and a machine learning model for inspecting pipelines; and a first processor communicatively coupled to the memory device, execution of the machine-readable instructions causing the first processor to:

receive wheel rotation information and caliper arm measurement data from a second processor of a caliper pig;

combine the caliper arm measurement data for different caliper arms that correspond to the same wheel rotation information;

parse the caliper arm measurement data into separate pipeline sections based on the wheel rotation information; and sequentially process each pipeline section using the machine learning model to detect pipeline features, assign a feature class to each pipeline feature, and determine an axial position, an angular position, linear dimensions, and a size for each pipeline feature.

20. The system of claim 19, wherein the feature class includes at least one of a deposit, a buckle, a dent, a presence of an ovality, a presence of an offtake, a presence of a fixture, a presence of a tee, a presence of a valve, a bend, a diameter change, a wall thickness change, a presence of a through-hole, a presence of a stress/strain zone, a presence of a weld, and a hard spot.

* * * * *